United States Patent
Hemmings

(10) Patent No.: US 11,175,131 B2
(45) Date of Patent: Nov. 16, 2021

(54) SELF-CONFIGURING COMPONENT IDENTIFICATION AND SIGNAL PROCESSING SYSTEM FOR A COORDINATE MEASUREMENT MACHINE

(71) Applicant: Mitutoyo Corporation, Kanagawa-ken (JP)

(72) Inventor: Scott Ellis Hemmings, Edmonds, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 670 days.

(21) Appl. No.: 16/019,340

(22) Filed: Jun. 26, 2018

(65) Prior Publication Data

US 2019/0004092 A1    Jan. 3, 2019

Related U.S. Application Data

(60) Provisional application No. 62/527,763, filed on Jun. 30, 2017.

(51) Int. Cl.
*G01B 21/04* (2006.01)
*G01R 1/073* (2006.01)
(Continued)

(52) U.S. Cl.
CPC .......... *G01B 21/047* (2013.01); *G01B 5/008* (2013.01); *G01R 1/073* (2013.01); *G05B 19/401* (2013.01);
(Continued)

(58) Field of Classification Search
CPC .................................................. G01B 21/047
See application file for complete search history.

(56) References Cited

U.S. PATENT DOCUMENTS 4,588,339 A    5/1986 Bilz
4,651,405 A    3/1987 McMurtry
(Continued)

FOREIGN PATENT DOCUMENTS

DE    195 43 763 A1    5/1997
DE    196 31 425 A1    2/1998
(Continued)

OTHER PUBLICATIONS

European Search Report, dated Oct. 8, 2018, for European Application No. 18180857.7-1022, 5 pages.
(Continued)

*Primary Examiner* — John E Breene
*Assistant Examiner* — Jeffrey C Morgan
(74) *Attorney, Agent, or Firm* — Seed IP Law Group LLP

(57) ABSTRACT

A set of respective self-configuring probe interface circuit boards (SC-MPIC's) are disclosed for use with a measurement system comprising host electronics and respective interchangeable measurement probes. Member SC-MPICs each comprises: a local circuit (LS) for probe identification, signal processing and inter-board signal control; and higher-direction and lower-direction connectors "pointing" toward and away from the measurement probe, respectively. Member SC-MPICs establish a processing hierarchy by generating lower board present signals on their higher-direction connector, higher board present signals on their lower-direction connector, and determining whether they are the highest and/or lowest SC-MPIC based on receiving those signals from adjacent SC-MPICs. They can independently perform probe identification matching operations using probe identification data from compatible and incompatible probes, and the highest SC-MPIC does this first. Member SC-MPICs advantageously pass through or isolate signals
(Continued)

from other members in the set depending on the hierarchy, various received signals, and internal processing.

20 Claims, 3 Drawing Sheets

(51) Int. Cl.
*G01B 5/008* (2006.01)
*G05B 19/401* (2006.01)
(52) U.S. Cl.
CPC .............. *G01B 2210/60* (2013.01); *G05B 2219/25294* (2013.01); *G05B 2219/49304* (2013.01); *G05B 2219/50063* (2013.01)

(56) References Cited

U.S. PATENT DOCUMENTS

| | | | |
|---|---|---|---|
| 4,660,141 A | | 4/1987 | Ceccon et al. |
| 5,440,181 A | | 8/1995 | Gruender, Jr. et al. |
| 5,615,404 A | | 3/1997 | Knoll et al. |
| 6,385,550 B1 | * | 5/2002 | Jansen ............... G01R 1/06788 324/115 |
| 7,061,926 B2 | | 6/2006 | Breinlinger |
| 7,096,077 B2 | | 8/2006 | Price et al. |
| 7,412,556 B2 | | 8/2008 | Dong et al. |
| 7,652,275 B2 | | 1/2010 | Gladnick |
| 8,438,746 B2 | | 5/2013 | Usui |
| 8,452,897 B1 | | 5/2013 | Fernald et al. |
| 2006/0047345 A1 | | 3/2006 | Kuwayama et al. |
| 2006/0088044 A1 | | 4/2006 | Hammerl |
| 2011/0176148 A1 | * | 7/2011 | Briggs ............... G01B 5/008 356/614 |
| 2012/0270419 A1 | * | 10/2012 | Shahoian ........... H01R 13/6471 439/55 |
| 2015/0285616 A1 | * | 10/2015 | Jordil ............... G01B 11/005 348/135 |

FOREIGN PATENT DOCUMENTS

| | | |
|---|---|---|
| DE | 100 57 284 A1 | 5/2002 |
| EP | 0 155 662 A2 | 9/1985 |
| EP | 0 236 414 B1 | 5/1991 |
| EP | 0 427 661 A2 | 5/1991 |
| EP | 1 117 279 A1 | 7/2001 |
| WO | 85/02138 A1 | 5/1985 |
| WO | 87/01798 A1 | 3/1987 |

OTHER PUBLICATIONS

Introduction to I²C and SPI protocols, URL=https://www.byteparadigm.com/applications/introduction-to-i2c-and-spi-protocols/, download date Aug. 24, 2018.

Ponikvar, I²C communication channel, Chapter 17, URL=https://www.fmf.uni-lj.si/~ponikvar/STM32F407project/I2C_Accel.pdf, download date Aug. 21, 2018.

International Search Report, dated Aug. 30, 2018, for International Application No. PCT/US2018/039077, 2 pages.

* cited by examiner

SELF-CONFIGURING COMPONENT IDENTIFICATION AND SIGNAL PROCESSING SYSTEM FOR A COORDINATE MEASUREMENT MACHINE

BACKGROUND

Technical Field

This disclosure relates to signal processing and control system configurations used in coordinate measuring machines, and/or other inspection systems, that use interchangeable measuring probes and/or sensors.

Description of the Related Art

Coordinate measurement machines (CMM's) can obtain measurements of inspected workpieces. One exemplary prior art CMM described in U.S. Pat. No. 8,438,746, which is hereby incorporated herein by reference in its entirety, includes a probe for measuring a workpiece, a movement mechanism for moving the probe, and a controller for controlling the movement. A CMM including a surface scanning probe is described in U.S. Pat. No. 7,652,275, which is hereby incorporated herein by reference in its entirety. As disclosed therein, a mechanical contact probe or an optical probe may scan across the workpiece surface.

CMM's or other robotic inspection systems may include a mounting joint, which may be referred to as an autojoint connection, which is compatible with a variety of interchangeable measuring probes or sensors. Each particular measuring probe or sensor may require a particular corresponding configuration for its power and/or signal interface to be provided through a standard set of pins or conductors in the autojoint connection. Such probes or sensors may include, for example, touch probes, contact or noncontact surface scanning probes, video cameras, and/or various other surface or defect sensors. Various systems have been used to identify what type of measuring probe (or sensor) is attached to an autojoint connection, in order to then provide the proper power and/or signal interface, for example in European patent EP236414, German Patent Applications DE10057284A1 and DE19543763A1, as well as U.S. Pat. No. 7,096,077 (the '077 patent), which is hereby incorporated by reference in its entirety. These patents and/or applications disclose the identification of particular probes based on detecting a particular resistance value included in the probe, as well as additional means of identification based on digital identification data included in a probe (which may be used in addition to, or instead of, the resistance value identification method). A proper interface configuration may be provided following the probe identification.

For example, the '077 patent discloses a configuration system comprising a tool (e.g. a measurement probe) that includes an identification module including tool identification data, and at least one interface circuit (e.g. residing in a CMM control system) that is used for conditioning signals provided by a particular tool (e.g. a measurement probe). The interface circuit also includes identification data. The configuration system disclosed in the '077 patent further includes an intermediate circuit in communication with both the tool and each interface circuit. The intermediate circuit is operable to provide an electrical link between the tool and an interface circuit if said tool identification data corresponds with the interface circuit identification data. The intermediate circuit thus performs a multiplexing function to connect a tool or probe to a corresponding one of the interface circuits that is connected to the intermediate circuit.

However, the configuration system disclosed in the '077 patent has some drawbacks. For example, the intermediate circuit may require additional space, wiring and connections, and fabrication expense. In addition, the intermediate circuit is relatively complex in that is must decode and match identification data from probes and interface circuits, and provide suitable interconnections. However, such an intermediate circuit that is adequate for current needs may not be compatible with future probes and/or their corresponding required interface circuits, which may have different data formats and/or power requirements, or the like. A need exists for a more economical, robust, flexible and "extendable" configuration system for automatically connecting interchangeable measuring probes and/or sensors to appropriate signal processing and control circuits.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

This disclosure relates to measurement and inspection systems, wherein signal processing and control systems automatically configure themselves for compatibility with each of a plurality of interchangeable measuring probes or sensors.

In various implementations, a measurement system may comprise a host electronic system, at least one interchangeable measurement probe, and a set of self-configuring measurement probe interface circuit boards (SC-MPIC's) comprising at least one member SC-MPIC, wherein each member SC-MPIC is a compatible match for operating in conjunction with a compatible measurement probe. Each member SC-MPIC may comprise a local signal processing and control circuit (LSPCC) comprising a probe identification matching portion; a probe signal processing portion; an inter-board signal portion; a higher-direction connector that is configured to connect to a compatible connection that extends along a higher direction from that SC-MPIC toward a measurement probe; and a lower direction connector that is configured to connect to a compatible connection that extends along a lower direction from that SC-MPIC away from the measurement probe. Each member SC-MPIC is configured for its higher-direction connector to be electrically connected to at least one of a) an interchangeable measurement probe connected to the measurement or inspection machine, and b) a lower-direction connector provided on a next higher direction member SC-MPIC. Each member SC-MPIC is configured for its lower-direction connector to be electrically connected to a higher-direction connector provided on a next lower direction member SC-MPIC. Each member SC-MPIC is configured to generate a lower board present signal on its higher-direction connector, which is indicative that it is to operate as a lower SC-MPIC relative to any other SC-MPIC located along the higher direction. Each member SC-MPIC is configured to generate a higher board present signal on its lower-direction connector, which is indicative that it is to operate as a higher SC-MPIC relative to any other SC-MPIC located along the lower direction. Each member SC-MPIC is configured to determine whether it is the highest SC-MPIC along the higher direction, responsive to on the presence or absence of a higher board present signal on its higher-direction connector. Each member SC-MPIC is configured to determine whether it is the lowest SC-MPIC along the lower direction, responsive to the presence or absence of a lower board present signal on its lower-direction connector. Furthermore, each member SC-MPIC is configured to perform a respective set of measurement probe identification matching operations responsive to probe identification signals provided or determined by a connected measurement probe, and if it is the highest SC-MPIC, then it is the first of any connected SC-MPIC's to perform its respective set of measurement probe identification matching operations.

In various implementations disclosed herein, member SC-MPIC's including the aforementioned features may operate individually with a connected measurement probe and host system, or a plurality of such member SC-MPIC's may automatically establish a hierarchy between themselves and automatically exchange or transfer the required signals of a connected measurement probe and host system, such that one of the member SC-MPIC's that is compatible with the connected measurement probe automatically identifies itself as a matching probe interface and assumes control of the connected measurement probe. The aforementioned features may be used in conjunction with additional features.

In various implementations, each member SC-MPIC may be configured such that if its respective set of measurement probe identification matching operations are indicative that it is a compatible match for the connected measurement probe, then that SC-MPIC generates a probe control taken signal on at least its lower-direction connector, which indicates that it will be the SC-MPIC operating in conjunction with the connected measurement probe. In some implementations, a member SC-MPIC may generate the probe control taken signal on both its lower-direction connector and its higher-direction connector. In some implementations, each member SC-MPIC may be configured to pass a received probe control taken signal to other connected SC-MPIC's.

In various implementations, each member SC-MPIC may be configured such that if its respective set of measurement probe identification matching operations are indicative that it is not a compatible match for the connected measurement probe, then that member SC-MPIC generates a "probe identification match assignment" signal on its lower-direction connector, which acts as a signal on the higher-direction connector of a next lower direction member SC-MPIC which is responsive to that signal to perform its respective set of measurement probe identification matching operations to determine if that next lower direction SC-MPIC is a compatible match for the connected measurement probe.

In various implementations, each member SC-MPIC may be configured to connect to a set of measurement probe connections of a connected measurement probe at its higher-direction connector, wherein the set of measurement probe connections is configured to transfer at least probe measurement signals, a probe power supply, and probe identification signals between the member SC-MPIC and the connected measurement probe. In various implementations, each member SC-MPIC may be configured to connect that set of measurement probe connections between its higher-direction connector and its lower-direction connector, at least during an operating mode corresponding to it receiving a probe control taken signal from another member SC-MPIC, and/or corresponding to its respective set of measurement probe identification matching operations indicating that it is not a compatible match for the connected measurement probe.

In some implementations, each member SC-MPIC may be configured to isolate its internal circuits from at least a subset of the set of measurement probe connections, at least during an operating mode corresponding to it receiving a probe control taken signal from another member SC-MPIC, and/or corresponding to its respective set of measurement probe identification matching operations indicating that it is not a compatible match for the connected measurement probe In some implementations, each member SC-MPIC may be configured to disconnect at least a subset of the set of measurement probe connections (e.g. the subset including a connection configured to transfer a probe power supply) between its higher-direction connector and its lower-direction connector, at least during an operating mode corresponding to that SC-MPIC assuming control of the connected measurement probe and/or generating the probe control taken signal.

In some implementations, each member SC-MPIC is configured to input digital data signals to a set of data connections through its higher-direction connector; and during at least one operating mode when it is not the lowest SC-MPIC, it outputs the digital data signals on a set of data connections through its lower-direction connector.

In various implementations, each member SC-MPIC comprises a terminating resistor connected between a first one of the set of data connections and a normally open controllable termination resistor switch that is connected to a second one of the set of data connections; and each member SC-MPIC is configured such that if it is the lowest SC-MPIC, then it operates the controllable termination resistor switch to connect the first and second ones of the set data connections through the termination resistor.

In some implementations the input digital data signals may include digital probe identification signals provided or determined by a connected measurement probe. The respective set of measurement probe identification matching operations of each member SC-MPIC may include operations that determine if the digital probe identification signals are indicative that it is a compatible match for the connected measurement probe. In some implementations, the digital probe identification signals comprise a digital subset of the probe identification signals provided or determined by the connected measurement probe, and the probe identification signals further comprise an analog probe identification signal. In some implementations, the analog probe identification signal identifies a corresponding class of measurement probes (e.g. the class corresponding to particular manufacturer, or global interface characteristics, or the like), and the digital subset of probe identification signals identifies a sub-class within that class of measurement probes (e.g. corresponding to particular probe interface or signal characteristics, or measurement signal processing, or the like.) In some implementations, each member SC-MPIC is configured to input the analog probe identification signal to an analog identification connection through its higher-direction connector, and independently determine whether the analog probe identification signal is indicative that it is a compatible match for the class of the connected measurement probe.

In some implementations, each member SC-MPIC is a compatible match for a corresponding measurement probe sub-class within the same class of measurement probes. In some such implementations, each member SC-MPIC is configured to input a class match confirmation signal to a class match confirmation connection through its higher-direction connector, and determine whether the class match confirmation signal is indicative that it is a compatible match for the class of the connected measurement probe. In various implementations, the input class match confirmation signal may be generated by a non-member interface board located in the higher direction relative to the highest member SC-MPIC, or a member SC-MPIC located in the higher direction relative to the member SC-MPIC that receives the input class match confirmation signal.

It will be understood that the higher-direction connector of the highest member SC-MPIC may be connected to a measurement probe through a connection path comprising at least one a non-member interface board located in the higher direction relative to that highest member SC-MPIC or connection wires that located in the higher direction relative to the highest member SC-MPIC. It will also be understood that the higher-direction connector of a member SC-MPIC that is not the highest member SC-MPIC may be connected to a measurement probe through a connection path comprising the highest member SC-MPIC. It will be understood that in some implementations, a single member SC-MPIC may determine that it is both the highest SC-MPIC and the lowest SC-MPIC. In other implementations a first member SC-MPIC may determines that it is the highest SC-MPIC, and a second member SC-MPIC may determines that it is the lowest SC-MPIC. In some implementations, one or more additional member SC-MPIC's may connected between the highest SC-MPIC and lowest SC-MPIC.

Through the use of various features and/or combinations of features outlined above and disclosed in greater detail below, in contrast to various prior art systems, a separate or "master" probe identification and/or multiplexing circuit is not required. Instead, each member SC-MPIC may simply operate to automatically determine its "cooperative" position within a set of SC-MPIC's, and subsequently determine whether or not it matches a connected measurement probe. Since new member SC-MPCI's may be developed contemporaneously a new types of measurement probes, they can be customized with the capability to identify and/or match the features of that particular probe. They need not have the capability to identify or support specific past or future probe features. Thus, the system architecture disclosed herein may be more reliable and "obsolescence proof" in comparison to previously known system architectures.

DETAILED DESCRIPTION

Figure 1:
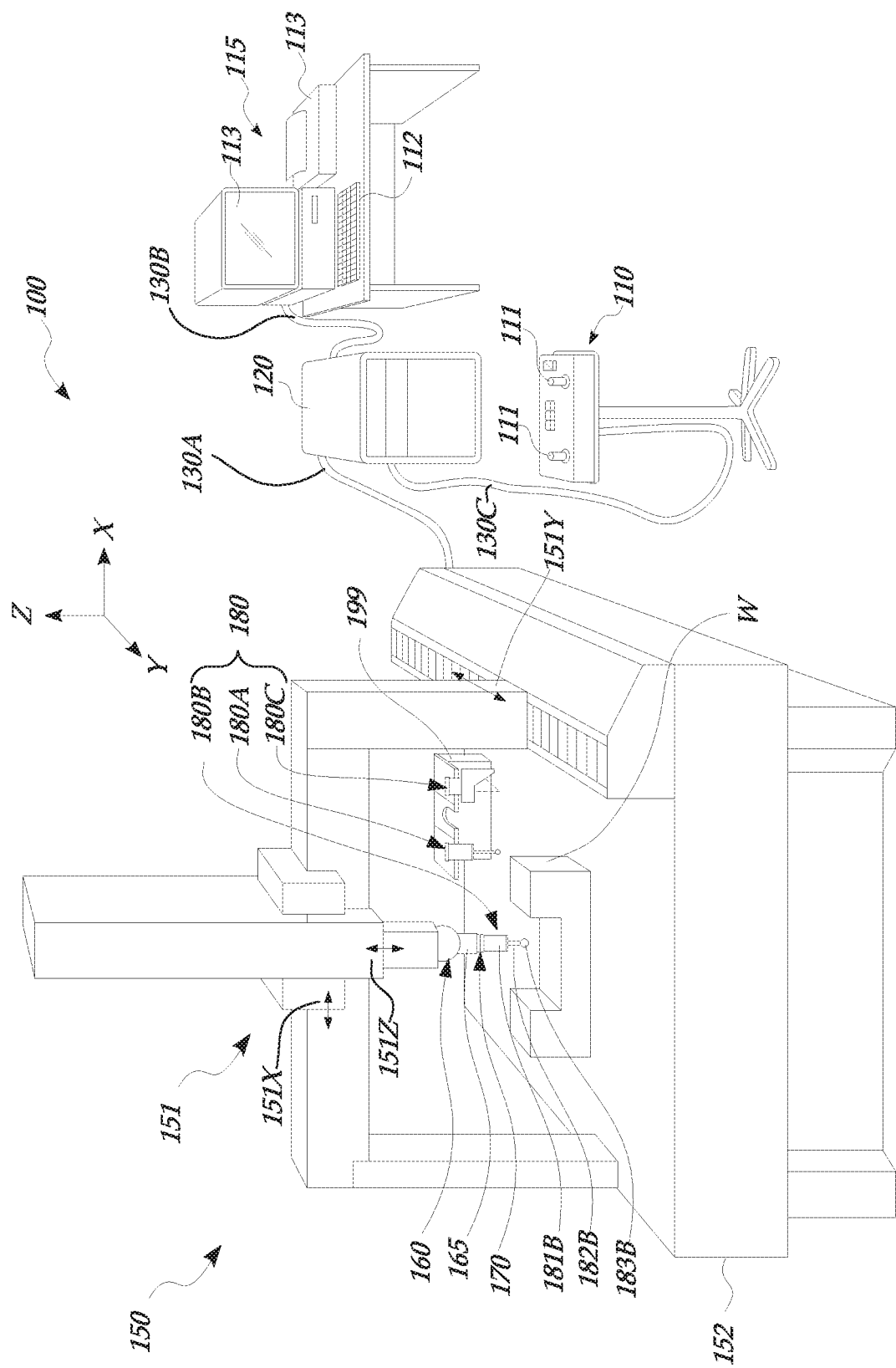
FIG. 1 is a diagram showing various typical components of a measuring system (e.g. a CMM) that utilizes an interchangeable measurement probe and is compatible with various SC-MPIC configurations disclosed herein.

FIG. 1 is a diagram showing various typical components of a measuring system 100 including a CMM 150 that utilizes an interchangeable measurement probe 180, and is compatible with various self-configuring measurement probe interface circuit board (SC-MPIC) configurations disclosed herein. The measuring system 100 may further include a manual operating unit 110, and a host electronic system comprising an interface electronics 120 and a host computer 115. The interface electronics 120 may include, for example, a motion controller that controls movements of the CMM 150, and interface circuits that connect to the measurement probe(s) 180 (e.g. through the signal and control lines 130A). The manual operating unit 110 may be coupled to the interface electronics 120 (e.g. through the signal and control lines 130C) and may include joysticks 111 for manually operating the CMM 150. The host computer 115 is coupled to the interface electronics 120 (e.g. through the signal and control lines 130B) and may operate the CMM 150 through user input or program control, and process measurement data for a workpiece W. The host computer 115 includes input means 112 (e.g., a keyboard, etc.) for inputting, for example, measurement conditions or instructions, and output means 113 (e.g., a display, printer, etc.) for outputting, for example, measurement results. In various embodiments, the host computer 115 and the interface electronics 120 may be merged and/or indistinguishable.

The CMM 150 includes a drive mechanism 151 which is located on a surface plate 152, and an attachment portion 165 (e.g. as included on an articulated head 160) for attaching an interchangeable measurement probe 180 to the drive mechanism 151. In various implementations, a measurement probe 180 (e.g. one of the measurement probes 180A-180C, which may be stored in a known type of storage rack 199 when not in use) may be automatically attached to the attachment portion 165 (e.g. under the control of an inspection program) at an autojoint connection 170, which may comprise precise kinematic mounting features and electrical connections that provide a physical interface that is common to various interchangeable measurement probes or sensors, according to known principles. An exemplary known technique and mechanism usable for the storage rack 199 and/or automatic exchange of a measurement probe 180 to and from a kinematic mounting at the autojoint 170 are described in U.S. Pat. No. 4,651,405, which is hereby incorporated herein by reference in its entirety. However, it will be appreciated that other known techniques and mechanisms may be used.

The drive mechanism 151 includes x-axis, y-axis, and z-axis slide mechanisms 151X, 151Y, and 151Z, for moving the measurement probe 180 three-dimensionally. In the particular implementation shown in FIG. 1, the measurement probe 180B, which is attached to the CMM at the autojoint 170, is a contact scanning type measurement probe and includes a probe body 181B, and a stylus 182B attached to a contact portion 183B. The stylus 182B is attached to the probe body 181B through a stylus suspension portion, which allows the contact portion 183B to freely change its position in three directions relative to the probe body when the contact portion 183B moves along a measurement path on the surface of the workpiece W. The measurement probe 180B includes sensors and circuits that sense the deflection of the stylus 182B (reflecting the position of the contact portion 183B) and outputs deflection or position data to the interface electronics 120 (e.g. through the signal and control lines 130A), as describe in greater detail below. However, this type of measurement probe is exemplary only and not limiting. More generally, any compatible type of interchangeable measurement probe (e.g. a touch probe 180A, or a non-contact scanning probe 180C, or a chromatic point sensor, or a camera) or other sensor may be used according to the principles disclosed herein.

It will be appreciated that the various principles disclosed below may be used to automatically configure an electronic interface circuit included in the interface electronics 120 to match any compatible measurement probe (or other sensor) 180 that is mounted to the CMM 150 (e.g. the probe 180B), even if the measurement probe or sensor is manually exchanged by a user, or stored in the storage rack 199 in an unknown or unexpected order, or the like.

Figure 2:
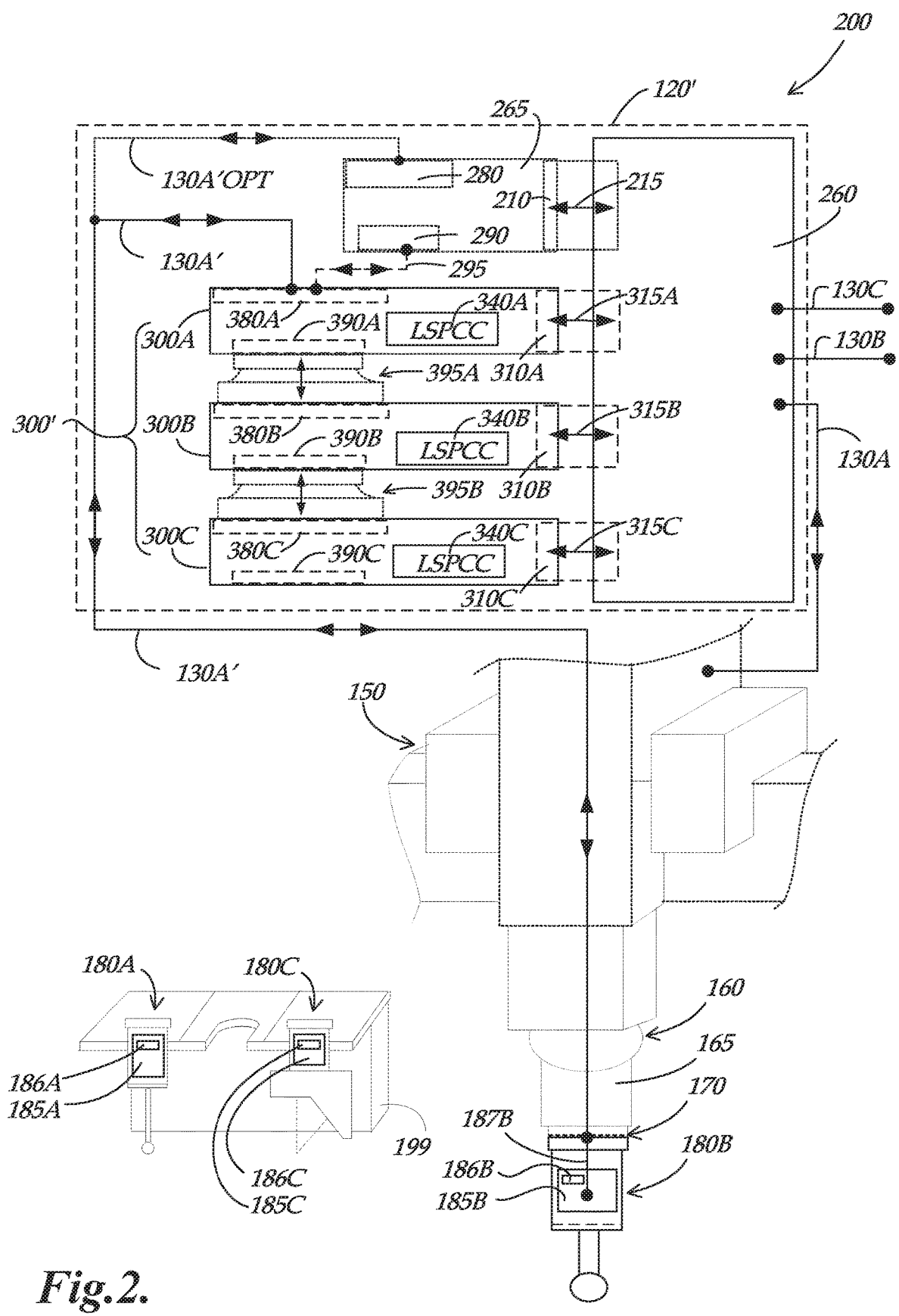
FIG. 2 is a block diagram that schematically shows an electrical arrangement including one implementation of a set of SC-MPIC's configured according to principles disclosed herein.

FIG. 2 is a block diagram that schematically shows an electrical arrangement 200 including one implementation of an SC-MPIC set 300' including respective member SC-MPIC's 300 (e.g. members 300A, 300B and 300C), configured according to principles disclosed herein. It should be appreciated that certain numbered components 1XX or 1XX' of FIG. 2 may correspond to and/or have similar operations as similarly numbered counterpart components 1XX of FIG. 1, and may be understood by analogy thereto, unless otherwise indicated by description or context below. This numbering scheme to indicate elements having analogous design and/or function may also be applied to the following FIG. 3.

FIG. 2 shows one embodiment of a measurement probe 1806 attached to the CMM 150 at the autojoint 170, and one embodiment of an interface electronics 120' comprising a SC-MPIC set 300' including the respective member SC-MPIC's 300A, 300B and 300C, which are connected to exchange respective power and data signals 315A, 3156 and 315C with a main system interface board 260, through host connections 310A, 310B and 310C, respectively. The host connections 310 (e.g. 310A) may comprise known circuit board card edge connectors, in one implementation.

According to a convention used herein, the higher direction relative to a component (such as one of the member SC-MPIC's) is not a fixed spatial direction, but rather is a "functional" connection or signal direction from the component toward a measurement probe that is attached to the CMM or other inspection system (e.g. the measurement probe 180B). Stated another way, the higher direction is a "functional" connection or signal direction extending from a component along a signal direction or path that leads closer to the measurement probe. (It will be understood the other circuits or connections may be located along the higher direction signal path between a component and the measurement probe, and/or form part of that signal path or connection.) Conversely, the lower direction relative to a component is a "functional" connection or signal direction extending from that component along a signal direction or path that leads farther away from the measurement probe.

Using this convention, in addition to the host connections 310 (e.g. 310A), each of the member SC-MPIC's 300 (e.g. 300A) further comprises a higher-direction connector 380 (e.g. 380A) and a lower-direction connector 390 (e.g. 390A), as well as local signal processing and control circuits (LSPCC) 340 (e.g. 340A), as described in greater detail below with reference to FIG. 3. It will be understood than when circuits are referred to herein, processors and operational software routines may be implicitly included. As shown in FIG. 2, in various embodiments, the measurement probe 180 (e.g. 180B) that is attached to the CMM 150 is connected to a first one of the member SC-MPIC's 300 (e.g. 300A) through signal and control line(s) 130A', which is schematically illustrated as separate from the signal and control line(s) 130A, for clarity. However, it will be understood that the signal and control line(s) 130A and 130A' may be part of the same multi-connection cable or bus structure in various implementations. Specifically, the implementation in FIG. 2 shows the signal and control line(s) 130A' are connected from the measurement probe 180A to the higher-direction connector 380A of the member SC-MPIC 300A, and its lower-direction connector 390A is connected to the higher-direction connector 380B of member SC-MPIC 300B through an inter-board connector 395A. Similarly, the lower-direction connector 390B of member SC-MPIC 300B is connected to the higher-direction connector 380C of member SC-MPIC 300C through the inter-board connector 395B. Generally speaking, the lower-direction connector 390 of any "higher" member of the SC-MPIC set 300' may be similarly connected to the higher-direction connector 380 of any "lower" member of the SC-MPIC set 300', such that the set 300' may include more or less interconnected member SC-MPIC's 300 than the specific set shown in FIG. 2 (e.g. 1 member, or 5 members, or more).

Briefly describing operations of the electrical arrangement 200, each of the member SC-MPIC's 300 include the local signal processing and control circuits (LSPCC) 340, which each comprise a respective probe identification matching circuit (described in greater detail below with reference to FIG. 3). The measurement probes 180 (e.g. 180A, 180B 180C) each include respective probe electronics 185 (e.g. 185A, 185B, 185C) comprising respective identification circuits 186 (e.g. 186A, 186B, 186C) which are configured to store and output digital identification data and/or analog identification signals corresponding to their respective type (e.g. their respective interface requirements, operating characteristics, etc.) according to known methods (e.g. as outlined in the incorporated references.) The identification circuits 186 output probe identification signals through identification signal line(s) 187 to the autojoint connection 170, and the signal and control line(s) 130A', to a first (highest) connected one of the member SC-MPIC's 300 in the interconnected set 300'. In various implementations, each of the member SC-MPIC's 300 are configured to operate individually with a compatible connected measurement probe 180 and host system (e.g. when a set 300' has a single member SC-MPIC that is compatible with the connected measurement probe 180), as well as in a set 300' comprising a plurality of member SC-MPIC's 300. Each member SC-MPIC is furthermore configured such that a plurality of member SC-MPIC's 300 in an interconnected set 300' may automatically establish a hierarchy between themselves and automatically exchange or transfer the required signals of a connected measurement probe 180 and host system, such that a respective one of the member SC-MPIC's 300 that is compatible with the connected measurement probe 180 automatically identifies itself as a matching probe interface and assumes control of the connected measurement probe 180.

Regarding automatically establishing a hierarchy, each member SC-MPIC 300 is configured to generate a lower board present signal on its higher-direction connector 380 (e.g. at the connection 384, shown in FIG. 3, based on operations of its LSPCC 340), which is indicative that it is to operate as a lower SC-MPIC relative to any other SC-MPIC located along the higher direction. Each member SC-MPIC 300 is furthermore configured to generate a higher board present signal on its lower-direction connector 390 (e.g. at the connection 395, shown in FIG. 3, based on operations of its LSPCC 340), which is indicative that it is to operate as a higher SC-MPIC relative to any other SC-MPIC located along the lower direction. Each member SC-MPIC 300 is further configured to determine whether it is the highest SC-MPIC along the higher direction, responsive to on the presence or absence of a higher board present signal on its higher-direction connector 380 (e.g. at the connection 385, shown in FIG. 3, based on operations of its LSPCC 340). Each member SC-MPIC 300 is furthermore configured to determine whether it is the lowest SC-MPIC along the lower direction, responsive to the presence or absence of a lower board present signal on its lower-direction connector 390 (e.g. at the connection 394, shown in FIG. 3, based on operations of its LSPCC 340). Furthermore, each member SC-MPIC is configured to perform a respective set of measurement probe identification matching operations (e.g. based on operations of its LSPCC 340) responsive to probe identification signals provided or determined by a connected measurement probe 180, and if it is the highest SC-MPIC 300, then it is the first of any connected SC-MPIC 300 to perform its respective set of measurement probe identification matching operations.

Regarding a respective one of the member SC-MPIC's 300 automatically identifying itself as a matching probe interface and assuming control of a connected measurement probe 180: As noted above each member SC-MPIC 300 comprises a respective probe identification matching circuit configured to perform a respective set of measurement probe identification matching operations responsive to the probe identification signals provided or determined by the connected measurement probe 180. Its probe identification matching operations are indicative whether or not it is a compatible match for the connected measurement probe 180. Various probe identification matching operations are outlined in greater detail below with reference to FIG. 3. In various implementations, each member SC-MPIC 300 may be configured such that if its respective set of measurement probe identification matching operations are indicative that it is a compatible match for the connected measurement probe 180, then that SC-MPIC 300 generates a probe control taken signal on at least its lower-direction connector 390 (e.g. at least the connection 396, illustrated in FIG. 3, and in some implementations also on the connection 386, illustrated in FIG. 3), which indicates that it will be the member SC-MPIC 300 operating in conjunction with the connected measurement probe 180. In various implementations, each member SC-MPIC 300 may furthermore be configured such that if its respective set of measurement probe identification matching operations are indicative that it is not a compatible match for the connected measurement probe 180, then that member SC-MPIC 300 generates a "probe identification match assignment" signal on its lower-direction connector 390 (e.g. on the connection 397, illustrated in FIG. 3). The next lower direction member SC-MPIC 300 is responsive to that signal (which it may receive on the connection 387, illustrated in FIG. 3) to accept the assignment and perform its respective set of measurement probe identification matching operations to determine if that next lower direction SC-MPIC 300 is a compatible match for the connected measurement probe.

The features outlined may operate as follows, with reference to the particular example shown in FIG. 2. Using the operations and signals outlined above for automatically establishing a hierarchy, the member SC-MPIC 300A may automatically be determined to be the "highest" member of the set 300' that is connected to the measurement probe 180B, and the member SC-MPIC 300C may automatically be determined to be the "lowest" member of the set 300'. In various embodiments, each member SC-MPIC is configured such that if it is the lowest member SC-MPIC of the set 300' (e.g. the member SC-MPIC 300C, in this example) then it operates to provide a termination resistor on certain data signal lines that are connected to a measurement probe 180 (e.g. 180B) and connected or passed through all the member SC-MPICs of the set 300', as outlined in greater detail below with reference to FIG. 3.

In various implementations, at least the "highest" member SC-MPIC 300A is configured to provide power and communicate with the measurement probe 180B, and receive its identification signals. In this example, the "highest" member SC-MPIC 300A is the first member SC-MPIC to perform its respective set of measurement probe identification matching operations. In this example, it is assumed that the probe identification matching operations of the "highest" member SC-MPIC 300A are indicative that it is not a compatible match for the connected measurement probe 180B. In various implementations, the member SC-MPIC 300A therefore generates a "probe identification match assignment" signal on its lower-direction connector 390A (e.g. on the connection 397, illustrated in FIG. 3).

The next lower direction member SC-MPIC 300B is responsive to the probe identification match assignment signal received on its higher-direction connector 380B (e.g. on the connection 387, illustrated in FIG. 3) to accept the assignment and perform its respective set of measurement probe identification matching operations. It receives the probe identification signals from the measurement probe 180B through the member SC-MPIC 300A, the inter-board connector 395A, and its higher-direction connector 380B. In this example, it is assumed that the probe identification matching operations of the member SC-MPIC 300B are indicative that it is a compatible match for the connected measurement probe 180B. In various implementations, the member SC-MPIC 300B therefore generates a probe control taken signal on at least its lower-direction connector 390B (e.g. on at least the connection 396, illustrated in FIG. 3, and in some implementations also on the connection 386, illustrated in FIG. 3), which indicates to other member SC-MPICs (e.g. 300C), that the member SC-MPIC 300B will be the member of the set 300' that will assume control and operate in conjunction with the connected measurement probe 180B. Various signal isolation and connection operations may be performed in the various interconnected member SC-MPICs of the set 300' as a result of (or in conjunction with) the occurrence of a probe control taken signal (e.g. output and/or input on the connections 386 and 396, illustrated in FIG. 3), as outlined in greater detail below with reference to FIG. 3.

It will be understood that in this example, if the probe identification matching operations of the member SC-MPIC 300B had indicated that it was not a compatible match for the connected measurement probe 1806, then it would have generated a "probe identification match assignment" signal on its lower-direction connector 390B (e.g. on the connection 397, illustrated in FIG. 3), and the next lower direction member SC-MPIC 300C would have been responsive to the probe identification match assignment signal received on its higher-direction connector 380C (e.g. on the connection 387, illustrated in FIG. 3) to accept the assignment and perform its respective set of measurement probe identification matching operations, and so on.

FIG. 2 also shows an alternative implementation, including an optional "non-member" interface board 265. In this alternative the signal and control line(s) 130A' would be connected between the measurement probe 180B and the interface board 265 as shown in dotted outline, and not to the member SC-MPIC 300A. Instead, the signals of the measurement probe 180B would be connected to the higher-direction connector 380A of the highest member SC-MPIC 300A through the interface board 265 and the connection 295. Stated another way, in this case the highest member SC-MPIC 300 (e.g. 300A) is connected to the measurement probe 180 (e.g. 180B) through the non-member interface board 265, and is not directly connected to the signal and control line(s) 130A'. It will be appreciated that contrary to various known systems the non-member interface board 265 need not perform any multiplexing or switching functions in relation to the various member SC-MPIC's of the set 300'. Rather, it may be a useful for other purposes. As one example, the various member SC-MPIC's of the set 300' may all be of a certain class (e.g. that class corresponding to a single measurement probe manufacturer). The various member SC-MPIC's of the set 300' may in that case be incompatible with other classes of probes (e.g. probes from a different manufacturer that operate on a different voltage.) In such a case, the non-member interface board 265 may be configured to act as a "buffer" or safe gateway that determines whether a connected measurement probe is of the same class as the member SC-MPIC's of the set 300'. Such a non-member interface board 265 may be configured to output (or withhold) a class match confirmation signal to the member SC-MPIC's of the set 300', which is a signal that they may safely enable their full set of connections and operations. In some cases, a non-member interface board 265 may be useful to identify a probe class or manufacturer based on known type of legacy analog signal that depends on a specific resistor value in the measurement probe 180 that is known to correspond to a specific probe class (e.g. a specific manufacturer, or specific probe technology, or the like.) It will be understood that in some implementations, the optional non-member interface board 265 may be included or omitted based on whether a CMM is expected to potentially be operated with different classes of measurement probes, or not. In various implementations, the member SC-MPIC's of the set 300' may be configured to operate either with, or without, the non-member interface board 265. It will be understood that the "non-member" interface board does not provide all the functions outlined and claimed herein for a member SC-MPIC, which is why it is designated a non-member interface board. For example, in one implementation, it may identify a probe class, but not specific types of probes within that class (e.g. it may lack sub-class digital probe identification circuits or stored data, for example).

Through the use of various features and/or combinations of features outlined above and disclosed in greater detail below, in contrast to various prior art systems, a separate or "master" probe identification and/or multiplexing circuit is not required. Instead, each member SC-MPIC may simply operate to automatically determine its "cooperative" position within a set of SC-MPIC's, and subsequently determine whether or not it matches a connected measurement probe. Since new member SC-MPCI's may be developed contemporaneously with new types of measurement probes, they can be customized with the capability to identify and/or match the features of that particular probe. They need not have the capability to identify or support specific past or future probe features. They need only have the capability to identify specific measurement probes that they are compatible with. Thus, this system architecture may be more reliable and "obsolescence proof" in comparison to previously known system architectures.

Figure 3:
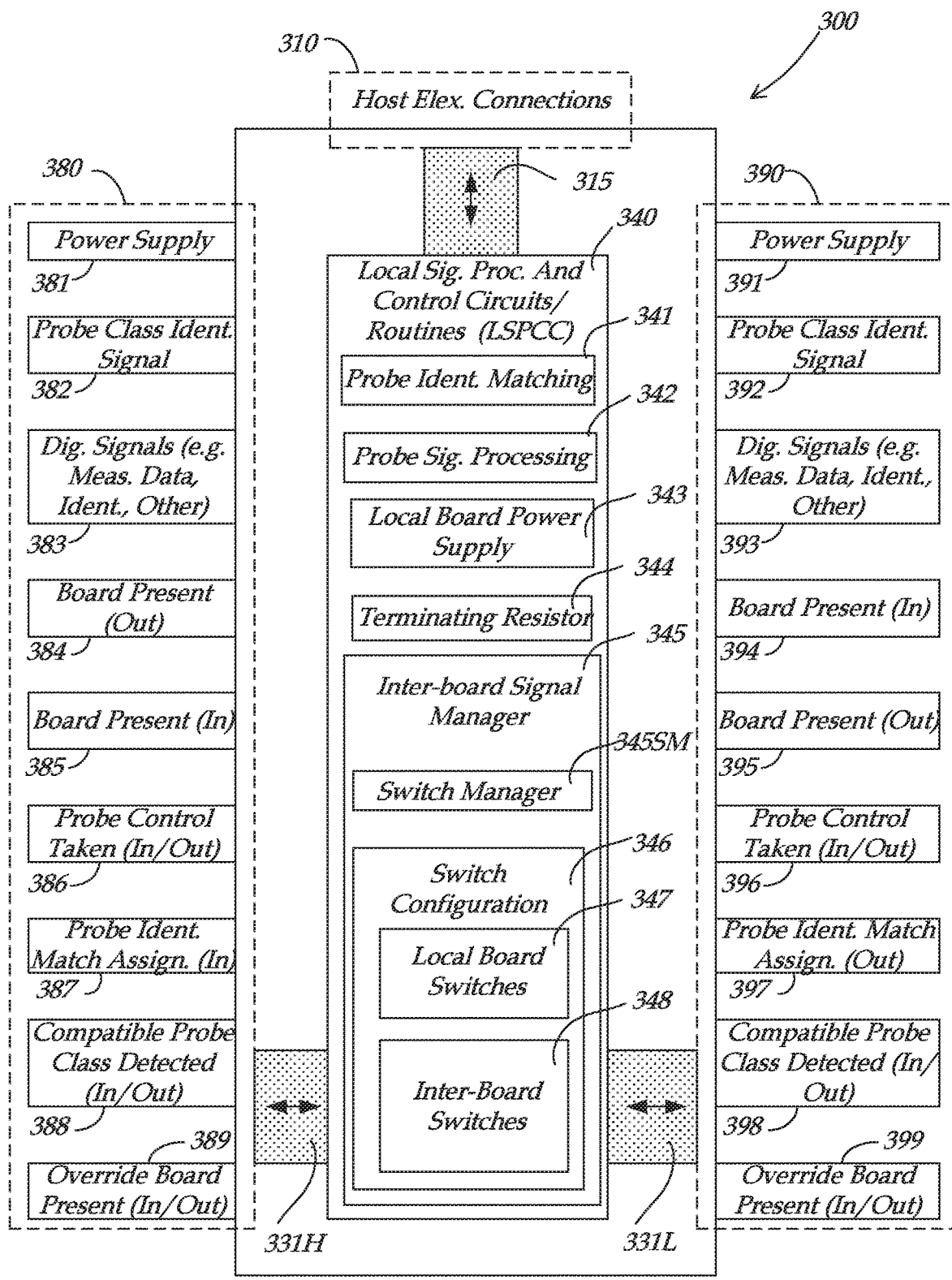
FIG. 3 is a block diagram that schematically shows various circuit elements and/or routines of one implementation of an SC-MPIC such as those shown in FIG. 2, as well as various signals which may be provided at its higher-direction and lower-direction connectors, according to principles disclosed herein.

FIG. 3 is a block diagram that schematically shows various circuit elements and/or routines of one implementation of a member SC-MPIC 300 such as those shown in FIG. 2, as well as various signals which may be provided at its higher-direction connector 380 and lower-direction connector 390, according to principles disclosed herein. As previously outlined, each member SC-MPIC 300 is a compatible match for operating in conjunction with a compatible measurement probe 180. Each member SC-MPIC 300 may comprise a local signal processing and control circuit (LSPCC) 340, that inputs and outputs various signals 331H at the higher-direction connector 380, inputs and outputs various signals 331L at the lower-direction connector 380, and inputs and outputs various signals 315 (e.g. probe measurement data, and other signals) at the host electronics connections 310. Such signals may include power supply connections. The LSPCC 340 may comprise a probe identification matching portion 341, a probe signal processing portion 342, an inter-board signal manager portion 345 (also referred to simply as an inter-board signal portion). In the illustrated implementation, the LSPCC 340 further comprises a local board power supply 343 (e.g. for providing a specific power supply voltage used in a compatible measurement probe), and a terminating resistor 344 described in greater detail below.

Each member SC-MPIC 300 may further comprise a higher-direction connector 380 that is configured to connect to a compatible connection that extends along a higher direction from that SC-MPIC 300 toward a measurement probe 180; and a lower direction connector 390 that is configured to connect to a compatible connection that extends along a lower direction from that SC-MPIC 300 away from the measurement probe 180. Each member SC-MPIC 300 is configured for its higher-direction connector 380 to be electrically connected to at least one of a) an interchangeable measurement probe (e.g. 180B) connected to the measurement or inspection machine (e.g. 150), and b) a lower-direction connector provided on a next higher direction member SC-MPIC (e.g. as shown in FIG. 2 for the member SC-MPCI's 300B and 300C). Each member SC-MPIC is configured for its lower-direction connector 390 to be electrically connected to a higher-direction connector provided on a next lower direction member SC-MPIC (e.g. as shown in FIG. 2 for the member SC-MPCI's 300A and 300B).

In the illustrated implementation the inter-board signal manager portion 345 comprises a switch manager 345SM which may control local board switches 347 (e.g. for connecting, or enabling or disconnecting or disabling various signals, circuits, and/or components within the circuits of the member SC-MPCI 300), and inter-board switches 348 (e.g. for connecting, or enabling or disconnecting or disabling various signals and or circuits connected to adjacent member SC-MPCI's, and/or a connected measurement probe 180. In one implementation, the LSPCC 340 comprises a gate array (e.g. a field programmable gate) including processing capability and memory for storing operating routines, compatible probe identification data, and the like, as well as supporting circuits and switches for providing the various functions of the LSPCC disclosed herein. The inter-board signal manager portion 345 may be implemented at least partially using such a gate array, in various embodiments. The inter-board signal manager portion 345, in addition to the operations of its switch manager 345SM, may also perform operations or signal routing in response to receiving various signals from other member SC-MPCI's at the connectors 380 and 390, as well as generating and/or routing various signals originating on the SC-MPIC 300 to a connected measurement probe at the connector 380, or other member SC-MPCI's at the connectors 380 and/or 390.

As illustrated in FIG. 3, in one exemplary implementation, the higher-direction connector 380 may include signal connections for power supply 381, probe class identification signal 382, digital signals 383 (e.g. comprising two or more connections for serial data and instructions, such as probe measurement data and/or commands, probe identification data, and so on), board present-out 384, board present-in 385, probe control taken 386, probe identification matching assignment-in 387, compatible probe class detected 388, and override board present 389. The lower-direction connector 390 may include signal connections for power supply 391, probe class identification signal 392, digital signals 393 (e.g. comprising two or more connections for serial data and instructions, such as probe measurement data and/or commands, probe identification data, and so on), board present-in 394, board present-out 395, probe control taken 396, probe identification matching assignment-out 397, compatible probe class detected 398, and override board present 399. Exemplary operations and signals associated with the connections 384, 385, 386, 394, 395 and 396 has been previously outlined with reference to FIG. 2, and may be understood based on that description.

In various implementations, using the various elements outlined above, each member SC-MPIC 300 may be configured (e.g. using the inter-board signal manager portion 345) to connect to a set of measurement probe connections of a connected measurement probe at its higher-direction connector 380, wherein the set of measurement probe connections is configured to transfer at least probe measurement signals (e.g. on the digital signals connections 383), a probe power supply (e.g. on the power supply connection 381), and probe identification signals (e.g. on the digital signals connection 383) between the member SC-MPIC 300 and the connected measurement probe (e.g. 180B). In various implementations, each member SC-MPIC may be configured to connect that set of measurement probe connections between its higher-direction connector 380 and its lower-direction connector 390, e.g. by providing pass-through connections 381 to 391, and 383 to 393, using the inter-board signal manager 345, in one implementation. Such pass-through connections may be provided at least during an operating mode corresponding to the member SC-MPIC 300 receiving a probe control taken signal (e.g. at the probe control taken connection 396) from another (e.g. lower) member SC-MPIC, and/or corresponding to its respective set of measurement probe identification matching operations indicating that it is not a compatible match for the connected measurement probe (e.g. as performed by the probe identification matching portion 341, based on probe identification data received on the digital signals connections 383.)

In some implementations, each member SC-MPIC 300 may be configured to isolate its internal circuits from at least a subset of the set of measurement probe connections, at least during an operating mode corresponding to it receiving the probe control taken signal from another member SC-MPIC (e.g. at the probe control taken connection 386 or 396), and/or corresponding to its respective set of measurement probe identification matching operations indicating that it is not a compatible match for the connected measurement probe In some implementations, each member SC-MPIC 300 may be configured to disconnect at least a subset of the set of measurement probe at its higher-direction connector from its lower-direction connector (e.g. disconnecting the connection 391, which may be temporarily connected to share a probe power supply with a lower member SC-MPIC, in some implementations), at least during an operating mode corresponding to that SC-MPIC assuming control of the connected measurement probe and/or generating the probe control taken signal.

In some implementations, each member SC-MPIC 300 is configured to input digital data signals to a set of data connections through its higher-direction connector 380 (e.g. at the connections 383, and/or 386, and/or 388 and/or 389); and during at least one operating mode when it is not the lowest SC-MPIC, it outputs the digital data signals on a set of data connections through its lower-direction connector (e.g. at the connections 393, and/or 396, and/or 398 and/or 399.)

In some implementations the input digital data signals (e.g. at the connections 383) may include digital probe identification signals provided or determined by a connected measurement probe 180 (e.g 180B). The respective set of measurement probe identification matching operations of each member SC-MPIC 300 (e.g. performed by the probe identification matching portion 341) may include operations that determine if the digital probe identification signals are indicative that it is a compatible match for the connected measurement probe. In some implementations, the digital probe identification signals comprise a digital subset of the probe identification signals provided or determined by the connected measurement probe 180, and the probe identification signals further comprise an analog probe identification signal. In some embodiments, the analog probe identification signal may be acquired at the connection(s) 382 through its higher-direction connector 380, or in some implementations at the connections 383 with a suitable temporarily connected circuit of the LSPCC 340 and signal processing on the member SC-MPIC 300, according to known methods disclosed in the various incorporated references. In some implementations, the analog probe identification signal identifies a corresponding class of measurement probes (e.g. the class corresponding to particular manufacturer, or global interface characteristics, or the like), and the digital subset of probe identification signals identifies a sub-class within that class of measurement probes (e.g. corresponding to particular probe interface or signal characteristics, or measurement signal processing, or the like.) In some implementations, using the features outlined above, each member SC-MPIC 300 may independently determine whether the analog probe identification signal is indicative that it is a compatible match for the class of the connected measurement probe. In some implementations, each member SC-MPIC 300 in a set of interconnected SC-MPCI's is a compatible match for a corresponding measurement probe sub-class within the same class of measurement probes. In some such implementations, each member SC-MPIC 300 may be configured to input a class match confirmation signal to a class match confirmation connection through its higher-direction connector 380 (e.g. at the connection 388), and determine whether the class match confirmation signal is indicative that it is a compatible match for the class of the connected measurement probe. In various implementations, the input class match confirmation signal may be generated by a non-member interface board (e.g. the non-member interface board 265, outlined with reference to FIG. 2 and located in the higher direction relative to the highest member SC-MPIC), or a member SC-MPIC located in the higher direction relative to the member SC-MPIC that receives an input class match confirmation signal, or generates a class match confirmation signal based on operations of its probe identification matching portion 341 (e.g. by evaluating an analog probe identification signal be acquired at the connection(s) 382). The member SC-MPIC 300 may be configure generate or pass through a class match confirmation signal that is output to a lower member SC-MPIC on the connection 398 of its lower direction connector 390. The member SC-MPIC 300 may optionally be configured to receive a signal from a non-member interface board (e.g. the non-member interface board 265) on the connection 389, and enable certain connections and/or operations in response to that signal, in order to take advantage of certain features or efficiencies that may be provided by the non-member interface board.) The member SC-MPIC 300 may be configured to connect or pass through the signal received on the connection 389 to the connection 399.

As previously outlined, based on signals received at the connections 385 and 395, each member SC-MPIC 300 may determine whether it is the highest member SC-MPIC, the lowest member SC-MPIC, or both (it is the only member SC-MPIC), or neither (e.g. it is connected between two other member SC-MPIC's). The digital signal connections 383 and/or 393 may provide connection points for a set of data lines (e.g. a pair of serial data communication lines suitable for RS-485 serial data communication, or the like.) In various implementations, each member SC-MPIC 300 may comprise a terminating resistor 344 connected between a first one of that set of data connections 383 and/or 393 and a normally open controllable termination resistor switch (e.g. located in the local board switched 347) that is connected to a second one of that set of data connections 383 and/or 393. Each member SC-MPIC 300 may be configured such that if it is the lowest SC-MPIC, then its switch manger 345SM operates the controllable termination resistor switch to connect the first and second ones of its set of data connections 383 and/or 393 through the termination resistor.

It will be appreciated that various known techniques may be used to communicate and/or pass through signals between a set of member SC-MPIC's. For example, in some implementations, some signals may be communicated or "passed through" by a respective shared wired connection between the members. Such a shared "passive" connection may be further attached to switchably connected to a signal source such as a pull-up resistor connected to a voltage supply. The signal source may be located on either on a host electronics board that is connected to all member SC-MPIC's, or "redundant" signal sources on each member SC-MPIC, in various implementations. In either case, the LSPCC 340 of any of the member SC-MPIC's 300 may execute operations that control a switch to connect the shared "passive" connection to the signal source. In other implementations, some signals may be communicated or "passed through" by the LSPCC 340 in each member SC-MPCI "actively" regenerating or reproducing an input signal at an appropriate output connection (e.g. by connecting an appropriate signal source located on that member SC-MPCI to the appropriate output connection.)

While preferred implementations of the present disclosure have been illustrated and described, numerous variations in the illustrated and described arrangements of features and sequences of operations will be apparent to one skilled in the art based on this disclosure. Various alternative forms may be used to implement the principles disclosed herein. In addition, the various implementations described above can be combined to provide further implementations. All of the U.S. patents and U.S. patent applications referred to in this specification are incorporated herein by reference, in their entirety. Aspects of the implementations can be modified, if necessary to employ concepts of the various patents and applications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled.

The invention claimed is:

1. A measurement system comprising a host electronic system, at least one interchangeable measurement probe, and a set of self-configuring measurement probe interface circuit boards (SC-MPIC) comprising at least one member SC-MPIC, wherein each member SC-MPIC is configured to connect to the host electronic system and to be a compatible match for operating in conjunction with a compatible measurement probe, and each member SC-MPIC comprises;
    a local signal processing and control circuit (LSPC circuit) comprising a probe identification matching portion, a probe signal processing portion, and an interboard signal manager;
    a higher-direction connector that is configured to connect to a compatible connection that extends along a higher direction from that SC-MPIC toward a measurement probe;
    a lower-direction connector that is configured to connect to a compatible connection that extends along a lower direction from that SC-MPIC away from the measurement probe;
    wherein:
        each member SC-MPIC is configured for its higher-direction connector to be electrically connected to at least one of a) an interchangeable measurement probe connected to the measurement or inspection machine, and b) a lower-direction connector provided on a next higher direction member SC-MPIC;
        each member SC-MPIC is configured for its lower-direction connector to be electrically connected to a higher-direction connector provided on a next lower direction member SC-MPIC;
        each member SC-MPIC is configured to generate a lower board present signal on its higher-direction connector, which is indicative that it is to operate as a lower SC-MPIC relative to any other SC-MPIC located along the higher direction;
        each member SC-MPIC is configured to generate a higher board present signal on its lower-direction connector, which is indicative that it is to operate as a higher SC-MPIC relative to any other SC-MPIC located along the lower direction;
        each member SC-MPIC is configured to determine whether it is the highest SC-MPIC along the higher direction, responsive to on the presence or absence of a higher board present signal on its higher-direction connector;
        each member SC-MPIC is configured to determine whether it is the lowest SC-MPIC along the lower direction, responsive to the presence or absence of a lower board present signal on its lower-direction connector; and
        each member SC-MPIC is configured to perform a respective set of measurement probe identification matching operations responsive to probe identification signals provided or determined by a connected measurement probe, and if it is the highest SC-MPIC, then it is the first of any connected SC- MPIC's to perform its respective set of measurement probe identification matching operations.

2. The measurement system of claim 1, wherein:

each member SC-MPIC is further configured such that if its respective set of measurement probe identification matching operations are indicative that it is a compatible match for the connected measurement probe, then that SC-MPIC generates a probe control taken signal on at least its lower-direction connector, which indicates that it will be the SC-MPIC operating in conjunction with the connected measurement probe.

3. The measurement system of claim 2, wherein:

each member SC-MPIC is configured such that if its respective set of measurement probe identification matching operations are indicative that it is a compatible match for the connected measurement probe, then that SC-MPIC generates a probe control taken signal on both its lower-direction connector and its higher-direction connector, which is indicative that it will be the SC-MPIC operating in conjunction with the connected measurement probe; and each member SC-MPIC is configured such that if it receives the probe control taken signal at one of its lower-direction connector or its higher-direction connector, it provides the probe control taken signal to any member SC-MPIC connected at the other of its lower-direction connector or its higher-direction connector.

4. The measurement system of claim 2, wherein:

each member SC-MPIC is configured to connect to a set of measurement probe connections of a connected measurement probe at its higher-direction connector, the set of measurement probe connections configured to transfer at least probe measurement signals, a probe power supply, and the probe identification signals between the member SC-MPIC and the connected measurement probe; and each member SC-MPIC is furthermore configured to connect to the set of measurement probe connections between its higher-direction connector and its lower-direction connector, at least during an operating mode corresponding to it receiving the probe control taken signal at one of its lower-direction connector or its higher-direction connector.

5. The measurement system of claim 4, wherein:

each member SC-MPIC is furthermore configured to isolate its internal circuits from at least a subset of the set of measurement probe connections, at least during an operating mode corresponding to it receiving the probe control taken signal at one of its lower-direction connector or its higher-direction connector.

6. The measurement system of claim 4, wherein:

each member SC-MPIC is furthermore configured to disconnect at least a subset of the set of measurement probe connections between its higher-direction connector and its lower-direction connector, at least during an operating mode corresponding to that SC-MPIC generating the probe control taken signal.

7. The measurement system of claim 6, wherein the disconnected subset comprises a connection configured to transfer a probe power supply.

8. The measurement system of claim 1, wherein:

each member SC-MPIC is further configured such that if its respective set of measurement probe identification matching operations are indicative that it is not a compatible match for the connected measurement probe, then that member SC-MPIC generates a "probe identification match assignment" signal on its lower-direction connector, which acts as a signal on the higher-direction connector of a next lower direction member SC-MPIC which is responsive to that signal to perform its respective set of measurement probe identification matching operations to determine if that next lower direction SC-MPIC is a compatible match for the connected measurement probe.

9. The measurement system of claim 8, wherein:

each member SC-MPIC is configured to connect to a set of measurement probe connections of a connected measurement probe at its higher-direction connector, the set of measurement probe connections configured to transfer at least probe measurement signals, a probe power supply, and probe identification signals between the member SC-MPIC and the connected measurement probe; and each member SC-MPIC is furthermore configured to connect to the set of measurement probe connections between its higher-direction connector and its lower-direction connector, at least during an operating mode corresponding to its respective set of measurement probe identification matching operations indicating that it is not a compatible match for the connected measurement probe.

10. The measurement system of claim 1, wherein:

each member SC-MPIC is configured to input digital data signals to a set of data connections through its higher-direction connector; and each member SC-MPIC is configured such that, during at least one operating mode when it is not the lowest SC-MPIC, it inputs the digital data signals to the set of data connections through its higher-direction connector, and outputs the digital data signals on a set of data connections through its lower-direction connector.

11. The measurement system of claim 10, wherein:

the input digital data signals comprise digital probe identification signals provided or determined by the connected measurement probe; and the respective set of measurement probe identification matching operations of each member SC-MPIC includes operations that determine if the digital probe identification signals are indicative that it is a compatible match for the connected measurement probe.

12. The measurement system of claim 11, wherein:

the digital probe identification signals comprise a digital subset of the probe identification signals provided or determined by the connected measurement probe;

the probe identification signals provided by the connected measurement probe further comprise an analog probe identification signal;

the analog probe identification signal identifies a corresponding class of measurement probes and the digital subset of the probe identification signals identifies a sub-class within that class of measurement probes; and the respective set of measurement probe identification matching operations of each member SC-MPIC further includes operations that determine whether the analog probe identification signal is indicative that it is a compatible match for the class of the connected measurement probe.

13. The measurement system of claim 12, wherein:

each member SC-MPIC is configured to input the analog probe identification signal to an analog identification connection through its higher-direction connector, and independently determine whether the analog probe identification signal is indicative that it is a compatible match for the class of the connected measurement probe.

14. The measurement system of claim 12, wherein:
each member SC-MPIC is a compatible match for a corresponding measurement probe sub-class within the same class of measurement probes; and
each member SC-MPIC is configured to input a class match confirmation signal to a class match confirmation connection through its higher-direction connector, and determine whether the class match confirmation signal is indicative that it is a compatible match for the class of the connected measurement probe.

15. The measurement system of claim 14, wherein the input class match confirmation signal is generated by at least one of a) a non-member interface board located in the higher direction relative to the highest member SC-MPIC, and b) a member SC-MPIC located in the higher direction relative to the member SC-MPIC that receives the input class match confirmation signal.

16. The measurement system of claim 10, wherein:
each member SC-MPIC comprises a terminating resistor connected between a first one of the set of data connections and a normally open controllable termination resistor switch that is connected to a second one of the set of data connections; and
each member SC-MPIC is configured such that if it is the lowest SC-MPIC, then it operates the controllable termination resistor switch to connect the first and second ones of the set data connections through the termination resistor.

17. The measurement system of claim 1, wherein the higher-direction connector of the highest member SC-MPIC is connected to a measurement probe through a connection path comprising at least one of a non-member interface board located in the higher direction relative to that highest member SC-MPIC, or connection wires that are located in the higher direction relative to the highest member SC-MPIC.

18. The measurement system of claim 17, wherein the higher-direction connector of a member SC-MPIC that is not the highest member SC-MPIC is connected to a measurement probe through a connection path comprising the highest member SC-MPIC.

19. The measurement system of claim 1, comprising a single member SC-MPIC that determines that it is both the highest SC-MPIC and the lowest SC-MPIC.

20. The measurement system of claim 1, comprising a first member SC-MPIC that determines that it is the highest SC-MPIC, a second member SC-MPIC that determines that it is the lowest SC-MPIC, and at least one member SC-MPIC connected between the highest SC-MPIC and lowest SC-MPIC.

* * * * *